(12) United States Patent
Jin

(10) Patent No.: US 12,406,875 B2
(45) Date of Patent: Sep. 2, 2025

(54) SUSCEPTOR INCLUDING PURGE GAS FLOW PASSAGE

(71) Applicant: MiCo Ceramics Ltd., Anseong-si (KR)

(72) Inventor: Jung-Chul Jin, Anseong-si (KR)

(73) Assignee: MiCo Ceramics Ltd., Anseong-si (KR)

( * ) Notice: Subject to any disclaimer, the term of this patent is extended or adjusted under 35 U.S.C. 154(b) by 0 days.

(21) Appl. No.: 18/977,079

(22) Filed: Dec. 11, 2024

(65) Prior Publication Data
US 2025/0191965 A1    Jun. 12, 2025

(30) Foreign Application Priority Data
Dec. 12, 2023 (KR) .................. 10-2023-0179465

(51) Int. Cl.
| | |
|---|---|
| H01L 21/68 | (2006.01) |
| B25B 11/00 | (2006.01) |
| H01L 21/687 | (2006.01) |

(52) U.S. Cl.
CPC .. *H01L 21/68785* (2013.01); *H01L 21/68792* (2013.01)

(58) Field of Classification Search
CPC . H01L 21/68; H01L 21/687; H01L 21/68792; H01L 21/68785; B25B 11/00; B25B 11/02
See application file for complete search history.

(56) References Cited

U.S. PATENT DOCUMENTS

| | | | |
|---|---|---|---|
| 8,394,199 B2 | 3/2013 | Tomita et al. | |
| 2004/0168767 A1* | 9/2004 | Kanno | H01L 21/67248 156/345.52 |
| 2006/0219176 A1 | 10/2006 | Tomita et al. | |
| 2009/0168292 A1 | 7/2009 | Watanabe et al. | |
| 2009/0235866 A1 | 9/2009 | Kataigi et al. | |
| 2015/0240358 A1 | 8/2015 | Kim et al. | |
| 2016/0002778 A1 | 1/2016 | Ravi et al. | |
| 2016/0225651 A1 | 8/2016 | Tran et al. | |
| 2019/0237353 A1 | 8/2019 | Thomas et al. | |
| 2020/0126773 A1 | 4/2020 | Unno et al. | |
| 2020/0312696 A1 | 10/2020 | Unno et al. | |

(Continued)

FOREIGN PATENT DOCUMENTS

| | | |
|---|---|---|
| JP | 2000252261 A | 9/2000 |
| JP | 2003142564 A | 5/2003 |

(Continued)

OTHER PUBLICATIONS

Notice of Allowance of JPO for Japanese application No. 2024-006621, issued on Oct. 15, 2024.

(Continued)

*Primary Examiner* — Lee D Wilson
(74) *Attorney, Agent, or Firm* — NKL Law; Jae Youn Kim

(57) ABSTRACT

Disclosed is a susceptor including a purge gas channel for supplying purge gas. The present disclosure provides a susceptor including: a plate having a heating element layer embedded therein; and a hollow shaft joined to a bottom of the plate, wherein the plate includes a purge gas channel layer disposed on a plane different from that of the heating element layer, and the purge gas channel layer includes an internal channel and multiple radial branch channels extending outward from the internal channel.

9 Claims, 4 Drawing Sheets

(56) References Cited

U.S. PATENT DOCUMENTS

| | | | |
|---|---|---|---|
| 2020/0350186 A1* | 11/2020 | Lal | H01L 21/67103 |
| 2020/0373187 A1 | 11/2020 | Singu et al. | |
| 2021/0050235 A1* | 2/2021 | Yun | H01L 21/68764 |
| 2021/0111058 A1* | 4/2021 | Ulavi | H01L 21/67103 |
| 2023/0207377 A1 | 6/2023 | Rane et al. | |
| 2024/0131534 A1* | 4/2024 | Watanabe | H05B 3/18 |
| 2024/0192611 A1* | 6/2024 | Jang | G03F 7/70908 |

FOREIGN PATENT DOCUMENTS

| | | |
|---|---|---|
| JP | 2006261670 A | 9/2006 |
| JP | 2009158829 A | 7/2009 |
| JP | 2009170497 A | 7/2009 |
| JP | 2009256789 A | 11/2009 |
| JP | 2011049428 A | 3/2011 |
| JP | 2018506853 A | 3/2018 |
| JP | 6438352 B2 | 12/2018 |
| JP | 2022050879 A | 3/2022 |
| JP | 2022147715 A | 10/2022 |
| JP | 2023098701 A | 7/2023 |
| KR | 100784216 B1 | 12/2007 |
| KR | 20150098808 A | 8/2015 |
| KR | 20170029550 A | 3/2017 |
| KR | 20200106981 A | 9/2020 |
| KR | 10-2020-0118902 A | 10/2020 |
| KR | 20200135734 A | 12/2020 |
| KR | 20230100634 A | 7/2023 |
| KR | 20230131658 A | 9/2023 |
| WO | 2019187785 A1 | 10/2019 |
| WO | 2019188681 A1 | 10/2019 |

OTHER PUBLICATIONS

Office Action of JPO for Japanese application No. 2024-006621, issued on Apr. 23, 2024.

Office Action of KIPO for Korean application No. 10-2023-0179465, issued on May 30, 2024.

* cited by examiner

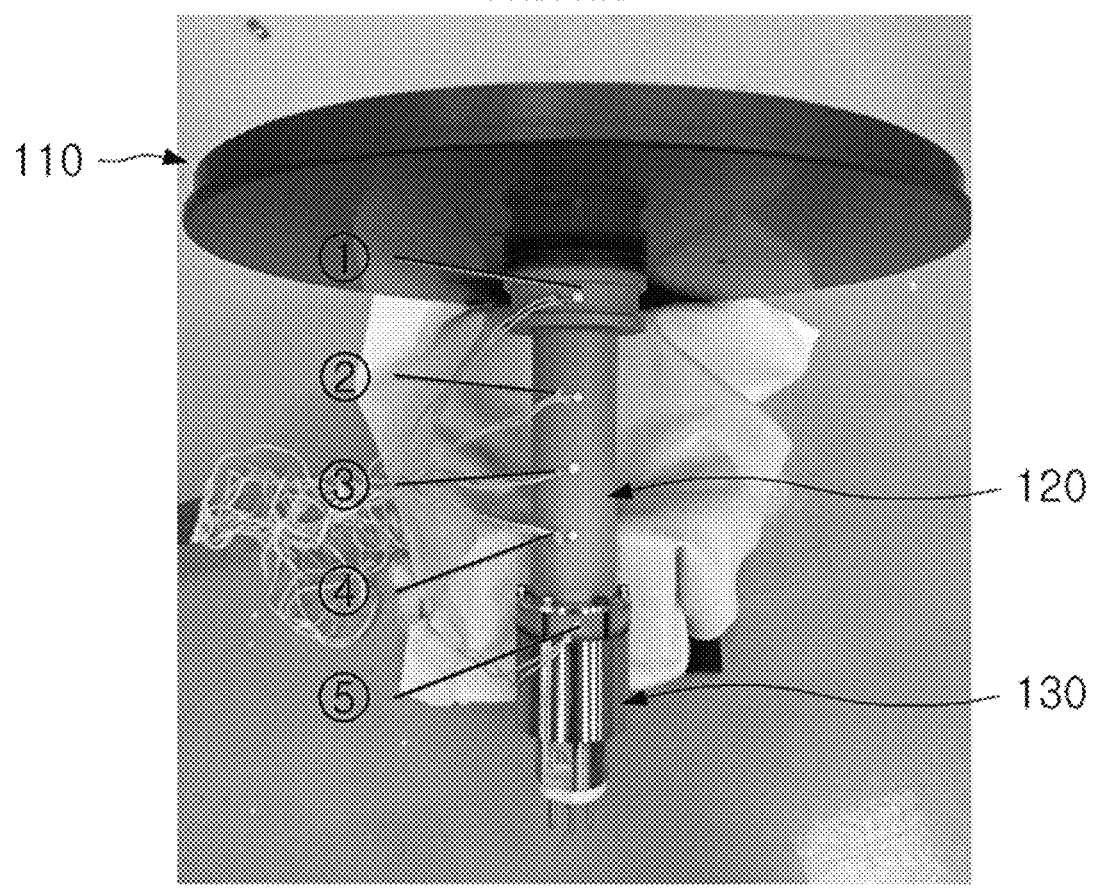

SUSCEPTOR INCLUDING PURGE GAS FLOW PASSAGE

CROSS-REFERENCE TO RELATED APPLICATION(S)

This application is based on and claims priority under 35 U.S.C. 119 to Korean Patent Application No. 10-2023-0179465, filed on Dec. 12, 2023, in the Korean Intellectual Property Office, the disclosure of which is herein incorporated by reference in its entirety.

BACKGROUND OF THE INVENTION

1. Field of the Invention

The present disclosure relates to a susceptor, and more particularly, to a susceptor having a purge gas channel for supplying a purge gas.

2. Description of the Prior Art

In general, a semiconductor device or a display device is manufactured through a semiconductor process of sequentially laminating multiple thin film layers including a dielectric layer and a metal layer on a glass substrate, a flexible substrate, or a semiconductor wafer substrate and then patterning the thin film layers. These thin film layers are sequentially deposited on the substrate through a chemical vapor deposition (CVD) process or a physical vapor deposition (PVD) process. The CVD process includes a low-pressure CVD (LPCVD) process, a plasma-enhanced CVD (PECVD) process, a metal-organic CVD (MOCVD) process, and the like. In CVD and PVD apparatuses, susceptors are placed to support glass substrates, flexible substrates, semiconductor wafer substrates, or the like and to execute semiconductor processes. Such a susceptor may be installed in a CVD apparatus and a PVD apparatus and include a heater plate having an embedded heating element to support and heat a substrate. In addition, the susceptor may be equipped with a radio-frequency (RF) electrode instead of or in addition to the heating element to be used for plasma formation in an etching process or the like for thin film layers on the substrate.

Meanwhile, in a thin film deposition process or the like using a susceptor, a purge gas channel is needed to supply purge gas to an edge of a wafer to suppress localized non-uniform deposition of the thin film at the wafer's edge.

Meanwhile, the purge gas channel formed inside the susceptor may have a radial structure to ensure symmetry with respect to the center of the plate.

However, the radial channels have different lengths from the shaft-side channel where purge gas is introduced, causing difficulties in supplying a uniform flow of purge gas around a wafer. Furthermore, since multiple radial channels branch off at specific points where the channels connect with a shaft, cracks are prone to form at the branching points due to the high pressure applied during the press joining of the plate and shaft.

SUMMARY OF THE INVENTION

The present disclosure was conceived to solve the aforementioned problems and provides a susceptor having a purge gas channel structure capable of supplying purge gas uniformly around a wafer edge area.

In addition, the present disclosure provides a susceptor having a purge gas channel structure suitable for suppressing crack formation during the press joining of the plate and shaft.

Furthermore, the present disclosure provides a susceptor structure capable of inhibiting heat transfer from the plate to the shaft.

In view of foregoing, the present disclosure provides a ceramic susceptor including a plate having a heating element layer embedded therein, and a hollow shaft joined to a bottom of the plate. The plate includes a purge gas channel layer disposed on a plane different from that of the heating element layer, and the purge gas channel layer includes an internal channel and multiple radial branch channels extending outward from the internal channel.

In the present disclosure, the hollow shaft may include a side wall extending in a longitudinal direction and a connecting portion at an end of the side wall forming a joint portion with the plate, and the internal channel may have a shape conforming to the connecting portion of the shaft.

In the present disclosure, the internal channel and the connecting portion may be circular. Here, on a plane projected onto the plate, the internal flow path may be confined within the contour of the connecting portion.

In the present disclosure, the internal channel may be disposed closer to a center of the plate within the contour of the connecting portion.

In addition, in the present disclosure, the ratio of a width of the internal channel to a width of the connecting portion is preferably 0.1 to 0.7.

In the present disclosure, the shaft may include a side wall channel extending in the longitudinal direction within the side wall, and an end of the side wall channel may be aligned with the internal channel.

Here, the susceptor may further include a mount coupled to the end of the shaft and a purge line around the side wall at the end of the shaft, and the purge line may be connected to the side wall channel.

In the present disclosure, the end of the side wall channel may be positioned at an intermediate point between adjacent radial branch channels on the internal channel.

In the present disclosure, the shaft may include multiple side wall channels extending in the longitudinal direction of the side wall within the side wall, and an end of each of the plurality of side wall channels may be aligned with the internal channel.

In the present disclosure, the multiple radial branch channels may be symmetrical about a center of the plate. In the present disclosure, the number of radial branch channels may be from 4 to 10.

According to the present disclosure, by providing the purge gas channel, which is symmetrical with respect to the center of the plate, it may become possible to uniformly supply purge gas near an edge of a wafer.

According to the present disclosure, by distributing the branching points of purge gas channels in this way, it may become possible to provide a purge gas channel pattern capable of suppressing cracking that may occur during the press joining of the plate and the shaft.

In addition, according to the present disclosure, it may become possible to provide a susceptor structure that reduces heat loss from the heating element of the plate to the shaft.

BRIEF DESCRIPTION OF THE DRAWINGS

The above and other aspects, features, and advantages of the present disclosure will be more apparent from the following detailed description taken in conjunction with the accompanying drawings, in which:

FIG. 4 is a photograph illustrating temperature variations based on positions on the shaft in a conventional susceptor.

DETAILED DESCRIPTION OF THE EXEMPLARY EMBODIMENTS

Figure 1A:
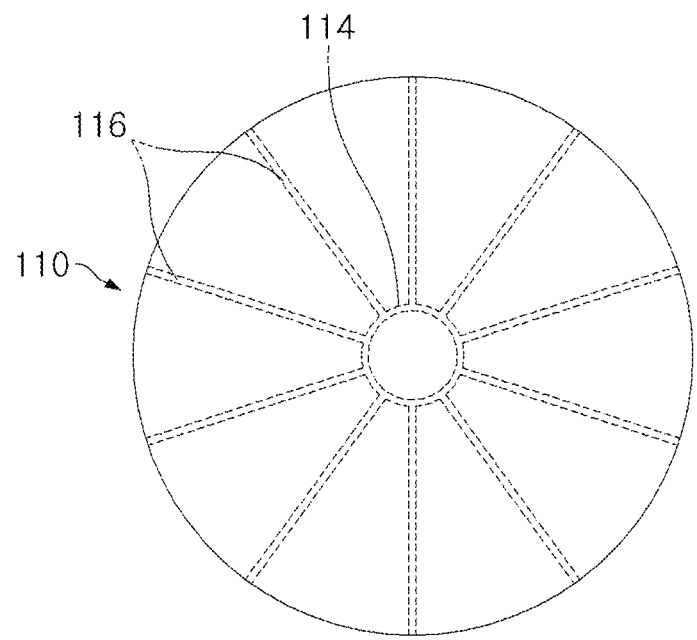
FIGS. 1A and 1B are schematic views illustrating a purge gas channel structure of a susceptor according to an embodiment of the present disclosure.

Hereinafter, the present disclosure will be described in detail with reference to the accompanying drawings. Herein, like components in each drawing are denoted by like reference numerals if possible. In addition, detailed descriptions of already known functions and/or configurations will be omitted. In the following description, components necessary for understanding operations according to various embodiments will be mainly described, and descriptions of elements that may obscure the gist of the description will be omitted. In addition, some elements in the drawings may be exaggerated, omitted, or schematically illustrated. The size of each component does not entirely reflect the actual size. Therefore, the descriptions provided herein are not limited by the relative sizes or spacings of the components drawn in each drawing.

In describing the embodiments of the present disclosure, when a detailed description of the known technology related to the present disclosure is determined to unnecessarily obscure the subject matter of the present disclosure, the detailed description will be omitted. In addition, terms to be described later are defined in consideration of functions in the present disclosure, and may vary according to the intention, custom, or the like of a user or operator. Therefore, the definitions of the terms should be made based on the description throughout this specification. Terms used in the detailed description are only for describing the embodiments of the present disclosure, and should not be construed as limiting in any way. Unless expressly used otherwise, singular expressions include the meanings of plural expressions. As used herein, expressions such as "including" or "comprising" are intended to indicate any features, numbers, steps, operations, elements, or some or combinations thereof, and should not be construed to exclude the existence or possibility of one or more other features, numbers, steps, operations, elements, or some or combinations thereof, in addition to those described above.

In addition, terms such as "first" and "second" may be used to describe various components, but the components are not limited by the terms, and these terms are only used for the purpose of distinguishing one component from another.

Figure 1B:
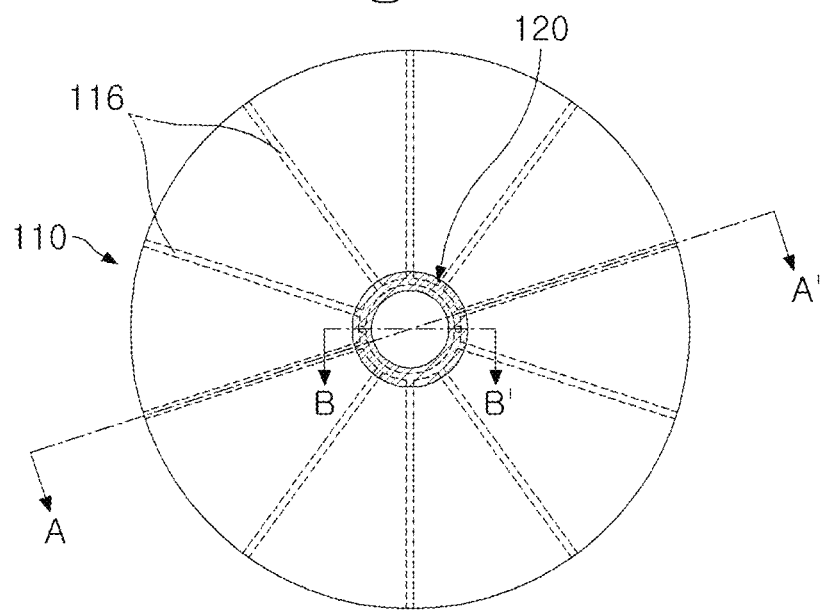

FIG. 1A is a schematic view illustrating a purge gas channel structure provided in a plate of a susceptor according to an embodiment of the present disclosure, and FIG. 1B is a schematic view illustrating a state in which the plate is coupled to a shaft.

Referring to FIG. 1A, as an example, the plate 110 includes purge gas channels 114 and 116 therein to supply purge gas outward from the center of the plate.

As illustrated, the purge gas channels include an internal channel 114 and radial branch channels 116 extending outward from the internal channel to the exterior of the plate. In the present disclosure, the internal channel 114 may follow the shape of the plate. As illustrated, the internal channel 114, which is circular, is provided following the circular shape of the plate. Of course, in the present invention, the shape of the internal channel is not necessarily limited to the shape of the plate.

In the present disclosure, the internal channel may be configured to conform to the circumferential direction of the shaft or correspond to a joint portion of the shaft.

In the present disclosure, the plate 110 may be formed of a plate-shaped ceramic material. As an example, the ceramic material may include at least one material or a compound selected from the group consisting of $Al_2O_3$, $Y_2O_3$, $ZrO_2$, TiN, AlN, TiC, MgO, CaO, $CeO_2$, $TiO_2$, $B_xC_y$, BN, $SiO_2$, SiC, YAG, YAP, and YAM. Preferably, the ceramic material may be aluminum nitride (AlN). When the ceramic material is AlN, the composition of the plate may further include at least one metallic compound, preferably a metallic oxide, selected from the group consisting of Y, Mg, Al, and/or Ti.

Meanwhile, multiple radial branch channels 116 branch off at regular intervals or angles along the circumference of the internal channel 114. In the present disclosure, while the number of radial branch channels or the intervals between them are not particularly limited, it is preferable for the multiple radial branch channels 116 to be symmetrically distributed at uniform angular intervals about the center of the plate in order to supply uniform purge gas along the outer periphery of the plate. In the present disclosure, for example, 4, 6, 8, 10, 12, or more radial branch channels may be provided.

Furthermore, in the present disclosure, the widths of the internal channel 114 and the radial branch channels 116 may be designed to be identical or different.

FIG. 1B is a schematic view illustrating the plate 110 and the shaft 120 in a coupled state. Referring to the view, when projected onto the plane of the plate, the position of the internal channel 114 of the plate overlaps the joint portion of the shaft 120. Preferably, the position of the internal channel 114 is confined within the joint portion of the shaft 120.

Figure 2A:
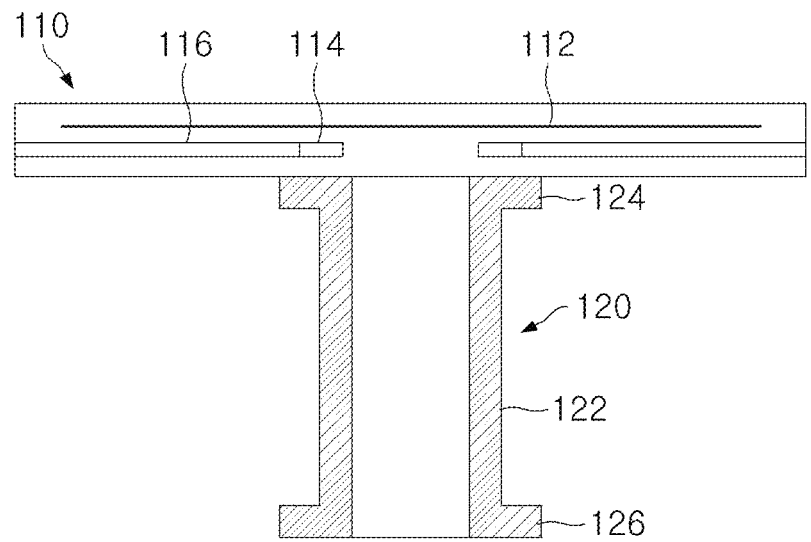
FIGS. 2A and 2B are cross-sectional views of the susceptor of FIGS. 1A and 1B.
Figure 2B:
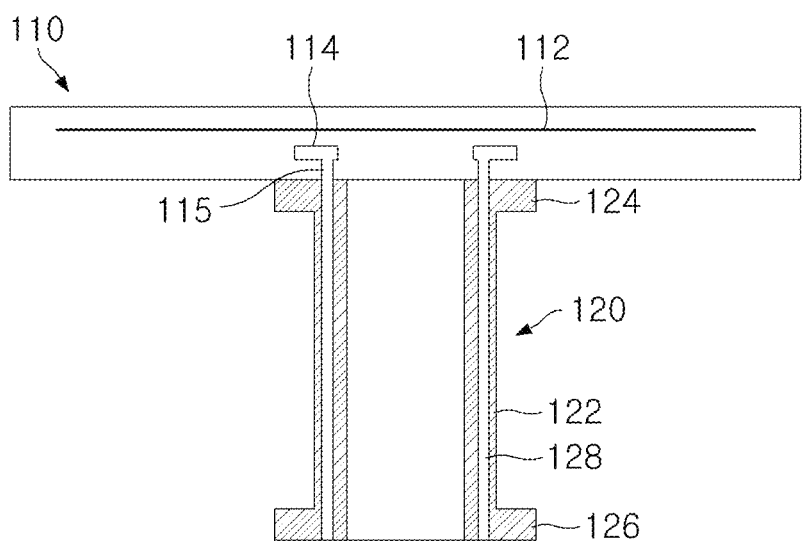

FIGS. 2A and 2B are schematic cross-sectional views taken along the A-A' and B-B' directions, respectively, in FIG. 1B.

Referring to FIG. 2A, the plate 110 has a heating element layer 112 embedded therein. The heating element layer may be configured with a coil or plate-shaped metal heating element and may form a predetermined pattern in a planar configuration. In addition, the heating element layer 112 may have a multilayer structure or form multiple zones for precise temperature control. In the present disclosure, the heating element forming the heating element layer may be made of at least one metal or an alloy selected from the group consisting of tungsten (W), molybdenum (Mo), silver (Ag), gold (Au), niobium (Nb), and titanium (Ti). Preferably, the heating element may be made of molybdenum (Mo). The heating element 112 may be connected to a power terminal via a power supply rod (not illustrated). The power supply rod may extend through the inner space of the shaft 120, pass through a mount, and extend to the exterior.

Meanwhile, inside the plate under the heating element 112, there is a purge gas channel layer that includes the internal channel 114 and the radial branch channels 116 branching from the internal channel 114.

The purge gas channel layer is provided on a plane different from that of the heating element layer 112. Although the purge gas channel layer is illustrated as being provided under the heating element layer in the present disclosure, it is, of course, possible for the channel layer to be provided above the heating element layer.

Meanwhile, a hollow shaft 120 is provided at the bottom of the plate 110. The shaft includes a side wall 122 extending in the axial direction and a connecting portion 124 at one end of the side wall, forming a joint portion with the plate 110. In the present disclosure, the connecting portion 124 may be a flange, but is not limited thereto. The other end 126 of the side wall may be coupled to a structure such as a mount (not illustrated).

The shaft 120 may be made of a ceramic material. As an example, the ceramic material may include at least one material or a compound selected from the group consisting of $Al_2O_3$, $Y_2O_3$, $ZrO_2$, TIN, AlN, TiC, MgO, CaO, $CeO_2$, $TiO_2$, $B_xC_y$, BN, $SiO_2$, SiC, YAG, YAP, and YAM. Preferably, the ceramic material may be aluminum nitride (AlN). When the ceramic material is AlN, the composition of the plate may further include at least one metallic compound, preferably a metallic oxide, selected from the group consisting of Y, Mg, Al, and/or Ti. Preferably, the shaft may be made of a ceramic material with low thermal conductivity. For example, the shaft may be an AlN sintered body containing 2 wt % or less of yttria as a sintering aid, where the thermal conductivity may be controlled by the content of the sintering aid, such as yttria. A shaft with extremely low thermal conductivity may be implemented by intentionally introducing impurities into AlN, such as by adding $Al_2O_3$, or by maintaining the content of metal in the sintered body at 1,000 ppm or less.

Referring to FIG. 2B, the side wall 122 of the shaft 120 is provided with a side wall channel 128 for the flow of purge gas. The side wall channel 128 extends in the axial direction of the shaft 120 within the side wall of the shaft and is in communication with the internal channel 114 of the plate. For this purpose, a communication hole 115 may be provided at the bottom of the internal channel 114 of the plate 110. In the present disclosure, the side wall channel may be spaced at least 3 mm away from the inner and outer walls of the shaft.

The communication hole 115 in the present disclosure is aligned with the internal channel 114 and the side wall channel. Preferably, the communication hole 115 is provided at a position away from the branching points of the radial branch channels 116 in the internal channel 114, i.e., at a non-intersecting point between the internal channel and the radial branch channels. This prevents gas introduced through the communication hole 115 from being excessively discharged into a specific radial branch channel 116. Preferably, the communication hole 115 is positioned midway between the branching points of adjacent radial branch channels 116 in the internal channel. In the present disclosure, the lengths of the multiple radial branch channels 116 may be set to be equal.

Although two side wall channels 128 are illustrated in the drawing, the present disclosure is not limited thereto. One side wall channel 128 or two or more side wall channels may be provided, and an appropriate number of communication holes may be included to ensure the uniform inflow of purge gas.

Meanwhile, in the present disclosure, the side wall channels are depicted as one-dimensional channels extending in the axial direction of the shaft with a predetermined length. However, the present disclosure is not limited thereto; the side wall channels may also be two-dimensional cylindrical channels extending along the circumference of the side wall of the shaft.

The shaft may be joined with the plate. In this case, a ceramic binder or ceramic paste may be used as a bonding agent. In the present disclosure, the ceramic binder or ceramic paste may primarily use aluminum nitride as the main raw material, but it is not limited thereto.

The channel structure of the present disclosure, as described with reference to FIGS. 1, 2A, and 2B, has the advantage of distributing structurally weak points within the plate by distributing the branching points to various locations along the internal channel. By distributing the branching points of purge gas channels in this way, it may be possible to provide a purge gas channel pattern capable of suppressing cracking that may occur during the press joining of the plate and the shaft.

In addition, the branching structure may implement a radial configuration that is symmetrical with respect to the center of the plate, allowing the purge gas to be uniformly discharged at the edge of the plate.

Furthermore, the channel structure of the present disclosure may provide an insulating mechanism that suppresses heat transfer to the shaft. This will be described with reference to FIG. 4.

Figure 3A:
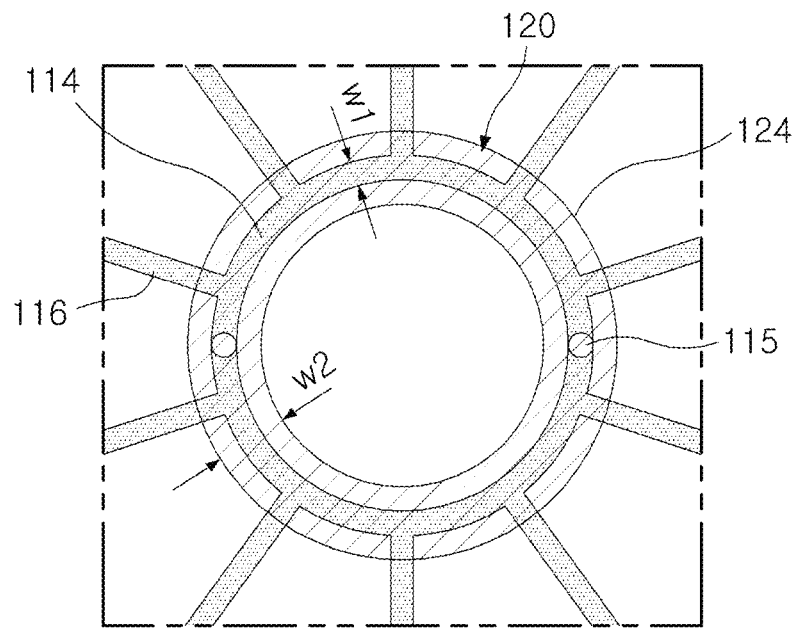
FIGS. 3A and 3B are views illustrating a channel structure of a susceptor according to an embodiment of the present disclosure.
Figure 3B:
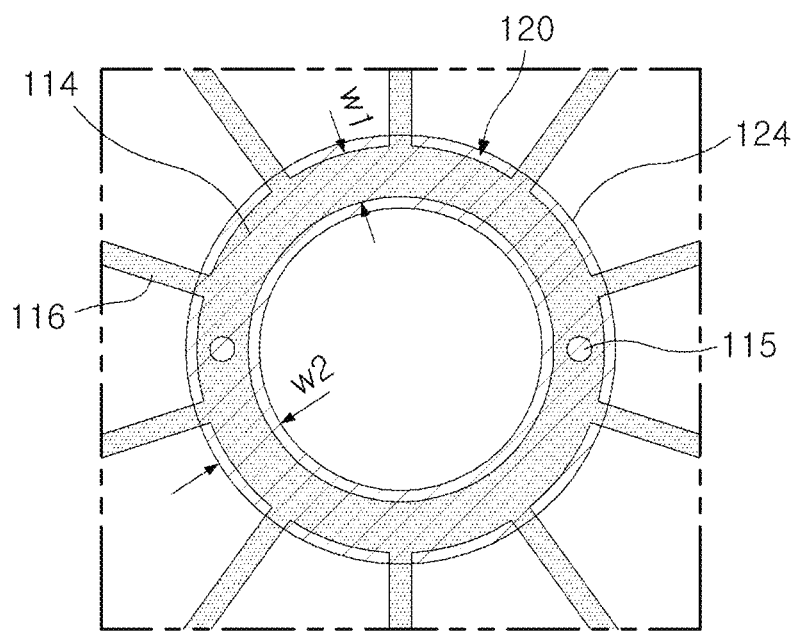

FIGS. 3A and 3B illustrate internal channels 114 having different areas on a plane projected on the plate. In FIGS. 3A and 3B, the internal channels 114 are positioned within the contour of the connecting portion 122, but the width w1 of the internal channel 114 may be adjusted.

As illustrated in FIG. 3A and FIG. 3B, when the width w1 of the internal channel increases, the channel area interposed between the heating element layer 112 and the shaft connecting portion 124 increases. In the present disclosure, since heat transfer through the channels relies on radiation or convection, the channels may act as insulating or heat-blocking elements compared to the highly thermally conductive plate body. In particular, since heat loss to the shaft occurs at the joint portion between the shaft and the plate, i.e., at the shaft connecting portion, it may be possible to suppress heat loss from the heating element layer by aligning the internal channel with the shaft connecting portion.

In the present disclosure, the width w1 of the internal channel may be designed to be smaller than the width w2 of the shaft connecting portion 124. The ratio of the width w1 of the internal channel to the width w2 of the connecting portion may be at least 0.1, 0.2, 0.3, 0.4, or 0.5. In addition, the ratio of the width w1 of the internal channel to the width w2 of the connecting portion may be 1 or less, 0.9 or less, 0.8 or less, 0.7 or less, 0.6 or less, 0.5 or less, or 0.4 or less. Preferably, the ratio may range from 0.1 to 0.7. Furthermore, according to the present disclosure, by adjusting the width of the internal channel, it may be possible to prevent heat loss through the shaft or suppress the occurrence of cracks. For example, when the ratio of the width w1 of the internal channel to the width w2 of the connecting portion is less than 0.1, it may become difficult to prevent heat loss, and when the ratio of the width of the internal channel exceeds 0.7, cracks may occur.

Meanwhile, although the drawings illustrate the internal channel positioned at the center of the contour of the connecting portion, the present disclosure is not limited thereto. In the present disclosure, the internal channel may be positioned closer to the center of the plate within the contour of the connecting portion, or conversely, positioned to be offset toward the outer side of the plate.

FIG. 4 is a photograph illustrating temperature variations based on positions on the shaft in a conventional susceptor. The temperatures measured at respective points ①, ②, ③, ④, and ⑤ after operating the susceptor at 650° C. of FIG. 4 are shown in Table 1 below.

TABLE 1

| Points | Temperature |
|---|---|
| ① | 609.7° C. |
| ② | 529.0° C. |
| ③ | 468.0° C. |
| ④ | 404.5° C. |
| ⑤ | 327.9° C. |

From the table above, it can be seen that the vicinity of the mount is exposed to high temperatures of 300° C. or higher. Heat generated from the heater plate is transferred through the shaft, and the temperature reaches a high temperature of 300° C. or higher up to the bottom area 5 where the mount 130 is mounted. This may lead to the melting of the O-ring sealing the mount, and in severe cases, the chamber vacuum may be compromised. Therefore, purge gas passing through the side wall channel may be utilized as a cooling gas. In other words, by providing a purge line along the circumference of the lower end of the shaft, the heat transferred to the mount can be reduced.

In the foregoing, the present disclosure has been described based on specific details, such as concrete components, limited embodiments, and drawings, but these have been provided merely to aid a more comprehensive understanding of the present disclosure, and the present disclosure is not limited to the above-described embodiments. Various modifications and alterations may be made without departing from the essential characteristics of the present disclosure by a person ordinarily skilled in the art to which the present disclosure pertains. Therefore, the spirit of the present disclosure should not be limited to the described embodiments, and not only the appended claims, but also all technical ideas that are equivalent or have equivalent modifications to the claims should be construed as being included within the scope of the present disclosure.

What is claimed is:

1. A susceptor comprising:
    a plate having a heating element layer embedded therein; and
    a hollow shaft joined to a bottom of the plate,
    wherein the plate comprises a purge gas channel layer disposed on a plane different from that of the heating element layer, and
    wherein the purge gas channel layer comprises an internal channel and multiple radial branch channels extending outward from the internal channel,
    wherein the hollow shaft comprises a side wall extending in a longitudinal direction and a connecting portion at an end of the side wall forming a joint portion with the plate,
    wherein the internal channel has a shape conforming to the connecting portion of the shaft,
    wherein, on a plane projected onto the plate, the internal channel is disposed within a contour of the connecting portion,
    wherein the shaft comprises a side wall channel extending in the longitudinal direction of the side wall within the side wall, and
    wherein a communication hole provided at the bottom of the internal channel of the plate, and the communication hole is aligned with the internal channel and the side wall channel.

2. The susceptor of claim 1, wherein the internal channel and the connecting portion are circular.

3. The susceptor of claim 1, wherein the internal channel is disposed closer to a center of the plate within the contour of the connecting portion.

4. The susceptor of claim 1, wherein a ratio of a width of the internal channel to a width of the connecting portion is 0.1 to 0.7.

5. The susceptor of claim 1, wherein the end of the side wall channel is positioned at an intermediate point between adjacent radial branch channels on the internal channel.

6. The susceptor of claim 1, further comprising:
    a mount coupled to the end of the shaft; and
    a purge line around the side wall at the end of the shaft, wherein the purge line is connected to the side wall channel.

7. The susceptor of claim 1, wherein the shaft comprises multiple side wall channels extending in the longitudinal direction of the within the side wall, and wherein an end of each of the multiple side wall channels is aligned with the internal channel.

8. The susceptor of claim 1, wherein the multiple radial branch channels are symmetrical about a center of the plate.

9. The susceptor of claim 1, wherein a number of radial branch channels is from 4 to 10.

* * * * *